United States Patent
Aderhold et al.

(10) Patent No.: US 7,667,162 B2
(45) Date of Patent: *Feb. 23, 2010

(54) SEMICONDUCTOR THERMAL PROCESS CONTROL UTILIZING POSITION ORIENTED TEMPERATURE GENERATED THERMAL MASK

(75) Inventors: Wolfgang R. Aderhold, Cupertino, CA (US); Balasubramanian Ramachandran, Santa Clara, CA (US); Leonid M. Tertitski, San Jose, CA (US); Patrick F. Stone, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/103,968

(22) Filed: Apr. 11, 2005

(65) Prior Publication Data
US 2005/0254804 A1    Nov. 17, 2005

Related U.S. Application Data

(63) Continuation of application No. 10/243,383, filed on Sep. 12, 2002.

(51) Int. Cl.
*H05B 1/02* (2006.01)
*C30B 25/16* (2006.01)
*F27B 5/14* (2006.01)

(52) U.S. Cl. .................... 219/494; 219/390; 219/444.1; 392/418; 118/725

(58) Field of Classification Search .................. 219/390, 219/444, 476–480, 405, 411, 494, 444.4; 118/724, 725; 392/416–421
See application file for complete search history.

(56) References Cited

U.S. PATENT DOCUMENTS

| | | | |
|---|---|---|---|
| 5,755,511 | A | 5/1998 | Peuse et al. |
| 5,781,693 | A | 7/1998 | Ballance et al. |
| 6,123,766 | A | 9/2000 | Williams et al. |
| 6,169,271 | B1 | 1/2001 | Savas et al. |
| 6,226,453 | B1 | 5/2001 | Yam et al. |
| 6,350,964 | B1 | 2/2002 | Boas et al. |
| 6,395,363 | B1 | 5/2002 | Ballance et al. |
| 2002/0098777 | A1* | 7/2002 | Laursen et al. ................. 451/6 |
| 2003/0209327 | A1* | 11/2003 | Kuznetsov et al. ..... 156/345.52 |
| 2003/0220706 | A1* | 11/2003 | Abenes et al. ................ 700/96 |

OTHER PUBLICATIONS

Letter from Applied Materials to Atmel Corporation (May 20, 2005).

(Continued)

*Primary Examiner*—Tu Ba Hoang
*Assistant Examiner*—Stephen J Ralis
(74) *Attorney, Agent, or Firm*—Townsend and Townsend and Crew, LLP

(57) ABSTRACT

During fabrication, a rotating semiconductor substrate is radiated in accordance with a thermal recipe. Temperature measurements of the semiconductor substrate are obtained along with the position of the semiconductor substrate at the time of each temperature measurement. It is then determined for the position of the semiconductor substrate whether at least one particular temperature measurement of the temperature measurements should be filtered. If so, at least one filtered temperature measurement is obtained. The radiation of the semiconductor substrate is subsequently controlled based on the temperature measurements, the at least one filtered temperature measurement, and the thermal recipe.

20 Claims, 8 Drawing Sheets

OTHER PUBLICATIONS

Letter from Atmel Corporation to Applied Materials (May 23, 2005).
Letter from Applied Materials to Atmel Corporation (Jun. 8, 2005).
Declaration of Wolfgang R. Aderhold with Exhibits A and B (May 3, 2006).
Office Action dated Feb. 9, 2009 for U.S. Appl. No. 10/243,383; pp. 6.
Office Action dated May 18, 2004 for U.S. Appl. No. 10/243,383; pp. 6.
Supplemental Notice of Allowance dated Mar. 22, 2005 for U.S. Appl. No. 10/243,383; pp. 1.
Notice of Allowance dated Oct. 3, 2007 for U.S. Appl. No. 10/243,383; pp. 7.
Notice of Allowance dated Dec. 14, 2004 for U.S. Appl. No. 10/243,383; pp. 7.
Non-Final Office Action for U.S. Appl. No. 10/243,383; mailed on Sep. 17, 2009; 5 pages.

* cited by examiner

SEMICONDUCTOR THERMAL PROCESS CONTROL UTILIZING POSITION ORIENTED TEMPERATURE GENERATED THERMAL MASK

CROSS-REFERENCES TO RELATED APPLICATIONS

This application is a continuation of U.S. application Ser. No. 10/243,383; filed Sep. 12, 2002, entitled "Semiconductor Thermal Process Control," having Wolfgang R. Aderhold et al. listed as inventors. The Ser. No. 10/243,383 application is assigned to Applied Materials, Inc., the assignee of the present invention and is hereby incorporated by reference.

BACKGROUND OF THE INVENTION

1. Field of the Invention

The invention relates generally to semiconductor thermal processing during fabrication. More particularly, the invention is directed to a system and method for filtering temperature anomalies from a closed-loop thermal control system.

2. Description of Related Art

Individual semiconductors or integrated circuit (IC) devices are typically formed on a semiconductor substrate by numerous different processes. A number of these processes require thermally processing the semiconductor substrate to allow various chemical and physical reactions to take place as the substrate is fabricated into multiple IC devices. The systems that perform the thermal processing typically include a heat source, a controller for controlling the heat source, and a substrate holder for holding the semiconductor substrate adjacent the heat source during thermal processing.

Modern thermal processing systems heat semiconductor substrates under controlled conditions according to predetermined thermal recipes. These thermal recipes fundamentally consist of a temperature that the semiconductor substrate must be heated to, and the time that the thermal processing system remains at that temperature. For example, thermal recipes may require the semiconductor substrate to be heated to distinct temperatures between 30 and 1200° C., for processing times at each distinct temperature of between 0 and 60 seconds.

To meet certain objectives, such as minimal diffusion, these thermal processing systems must also restrict the amount of time that each semiconductor substrate is subjected to a high temperature. To accomplish this, the temperature ramp rate is often very steep, i.e., the thermal processing system often needs to change from a high to low temperature, or visa versa, in as short a time as possible.

These steep temperature ramp rates led to the development of Rapid Thermal Processing (RTP). During RTP the semiconductor substrate is irradiated with a radiant heat source powerful enough to quickly raise the temperature of the semiconductor substrate to the desired process temperature and hold it at that temperature for a sufficient period of time to accomplish a specific process step. Typical temperature ramp rates for RTP range from 20-250° C./second as compared to 5-15° C./minute for conventional furnaces.

RTP is typically used for thermal oxidation, Chemical Vapor Deposition (CVD), substrate bonding, and annealing. What is more, RTP is rapidly becoming the technology of choice for oxidation and annealing steps in advanced ultra-large scale integration (ULSI) fabrication.

The radiant heat sources used in RTP systems are mostly tungsten-halogen or arc lamps arranged in a linear or circular array. This array is typically located directly above, below, or both above and below the semiconductor substrate. RTP systems typically also rotate the semiconductor substrate while irradiating it to more evenly distribute temperature across the surface of the semiconductor substrate.

Since these lamps have very low thermal mass relative to furnaces, the substrate can be heated rapidly. Rapid substrate cooling is also easily achieved since the heat source may be turned off quickly without requiring a slow temperature ramp-down. Lamp heating of the substrate minimizes the thermal mass effects of the process chamber and allows rapid real time control over the substrate temperature.

An example of a typical prior art RTP system 102 is shown in FIG. 1. An example of such a system is disclosed in Applicant's U.S. Pat. Nos. 5,660,472; 5,689,614; 5,755,511; 5,781,693; 6,123,766; 6,350,964; 6,395,363, all of which are incorporated herein by reference. Furthermore, Applicant's tools incorporating such a system are sold under the RADIANCE® brand.

The RTP system 102 is shown in an open or non-operational position. Such an RTP system 102 comprises a lid 104 housing a circular array of concentric zones of heating lamps 110, and a RTP chamber 108 housing a semiconductor substrate 106. These arrays typically have about two hundred lamps for a 200 mm semiconductor substrate.

Each concentric zone of heating lamps is separately controlled by a controller 114 that is used to heat the substrate according to a predetermined thermal recipe. Temperature probes (not shown) under the substrate are used to feedback a measured temperature to the controller 114. This allows the controller to adjust each zone of concentric heating lamps to ensure that the measured temperature reflects a desired temperature dictated by the thermal recipe.

Semiconductor substrates 106 typically include areas on the surface of the substrate, which are indicated by cross-hatching, where integrated circuits (ICs), such as transistors, have or will be formed (hereinafter "IC area's"), and areas where no ICs are or will be formed (hereinafter "open area's") 112. The open area's are formed for a number of reasons. For example, ICs typically cannot be formed at the substrate edge, or around other non-IC features on the substrate. Such non-IC features include: alignment or registration features on the substrate, which are used to align semiconductor masks; a laser scribe or other identification feature for identifying each substrate; a hole used to align the substrate in each processing tool; or the like. These features are described in further detail in relation to FIG. 2B.

In use, the semiconductor substrate is typically rotated at several to several hundred revolutions per minute. However, in a preferred embodiment, the semiconductor substrate is rotated at ninety revolutions per minute. Therefore, the temperature probes measure different areas of the substrate at each instant of time. Furthermore, as the IC area's and open area's may have significantly different thermal and optical properties, the open area's may absorb more or less heat than the IC area/s. Therefore, the temperature probes adjacent the open area's could measure significantly higher or lower temperatures. To account for this difference, i.e., different temperatures measured adjacent the open area/s, the controller 114 attempts to adjust the temperature of the heating lamps. This results in different segments of the IC area's being exposed to different temperatures, which results in the IC area/s not being heated uniformly, as is typically required by the thermal recipe. Such non-uniformity leads to slip, warpage, and/or deformation of the substrate. Slip and/or warpage makes alignment of subsequent masks difficult, if not impossible, as each layer is built upon a previous layer. Alignment of each mask is made using alignment marks on the substrate, which if not always aligned with the mask, can ruin dies, significantly reduce yield, or even destroy entire substrates.

In addition, non-uniformity of the substrate leads to non-uniform material properties, such as alloy content, grain size, and dopant concentration. These nonuniform material properties degrade the circuitry and decrease IC device yield per semiconductor substrate.

One prior art system compensating for these substrate temperature non-uniformities caused by open area's, uses low pass filters or notch filters for the temperature data for all temperature probes. For example, where the thermal recipe calls for a temperature of 1000° C., the temperature probes 1-6 and 8 read 1000° C., while temperature probe 7, at an open area, reads 1020° C. at 20% of all time steps and 1000° C. at 80% of all time steps. The low pass or notch filter will average such measured temperatures and yields a measured temperature of 1004° C. Therefore, the controller will lower the temperature of the lamps by 4° C. to 996° C. at the temperature probe 7 position. This is unacceptable, as the thermal profile is adjusted either above or below the temperature required by the thermal recipe.

In addition, prior art systems that utilize low pass filters slow down the temperature response of the controller and/or the radiation source, thereby reducing controllability of the thermal process. This hampers fast temperature ramp-up and ramp-down rates, which are required by most RTP thermal recipes.

Since the above described notch or low pass filters do not differentiate between critical temperature data at IC area's and non-critical temperature data at open areas, it is common practice to minimize the open areas on the substrate by stepping out all masks to the edge of the substrate, thereby making the substrate as uniform as possible. This is extremely costly, and almost impossible for high-resolution masks.

In light of the above, there is a need for a system and method for filtering temperature anomalies from a closed-loop thermal control system, without sacrificing temperature response or compromising the thermal recipe.

BRIEF SUMMARY OF THE INVENTION

According to the invention there is provided a method for controlling a semiconductor thermal process. A semiconductor substrate is radiated in accordance with a thermal recipe. Temperature measurements of the semiconductor substrate are then obtained along with information concerning the position of the semiconductor substrate at the time of each temperature measurement. It is then determined for a particular position of the semiconductor substrate, whether at least one particular temperature measurement of the temperature measurements should be filtered. If so, at least one particular temperature measurement is then filtered to obtain at least one filtered temperature measurement. The radiation of the semiconductor substrate is subsequently controlled based on the temperature measurements, the at least one filtered temperature measurement, and the thermal recipe.

Further according to the invention there is provided a system for controlling a semiconductor thermal process. The system includes a radiation source, multiple temperature probes, a position detector, and a controller. The radiation source is configured to irradiate a semiconductor substrate; each of the temperature probes is configured to measure temperatures of the semiconductor substrate; and the position detector is configured to determine the position of the semiconductor substrate. The controller includes a central processing unit, input ports, output ports, and a memory. The input ports are configured for communicating with the temperature probes and the position detector, while the output ports are configured for communicating with the radiation source. The memory includes a thermal recipe and a masking profile consisting of a list of positions of the semiconductor substrate and associated temperature probes where filtering should occur. The memory also includes measurement procedures for obtaining temperature measurements from the temperature probes, and for obtaining a position of the semiconductor substrate from the position detector. Filtering procedures in the memory filter temperature measurements obtained from the temperature probes to obtain at least one filtered temperature measurement. The filtering is based on the position of the semiconductor substrate and the masking profile. Control procedures in the memory supply power to the radiation source based on the temperature measurements obtained from the temperature probes, the at least one filtered temperature measurement, and the thermal recipe.

Still further according to the invention there is provided a computer program product for controlling a semiconductor thermal process. The computer program product includes a computer readable storage medium and a computer program mechanism embedded therein. The computer program mechanism includes instructions for performing the above described method.

The above described system and method enables precise temperature control of the critical IC area's. This reduces costs of having to step out all mask layers to the edge of the substrate.

Furthermore, the above described system and method prevents erroneous controller output in response to temperature anomalies or spikes. This reduces the stress and increases the life of the radiation source. Such a system and method also reduces the temperature stress of the substrate, but still allows rapid temperature changes of the radiation source.

In addition, this system and method can also be used with standard controllers, as it modifies the temperature input to the controller, without altering the response, dynamics, or stability of the controller.

Still further, this system and method results in improved mask alignment, due to better temperature uniformity of the IC area's. Also, this system and method results in reduced substrate slip.

In yet another embodiment of the invention, a method for centering a substrate within a process chamber is provided. An unprocessed substrate is radiated within a tool. The unprocessed substrate is then rotated within the tool and temperature measurements of the unprocessed substrate are obtained. The position of the unprocessed substrate when each of the temperature measurements is obtained is also established. It is then determined whether the temperature measurements include any temperature anomalies. Finally, a robot that positions the unprocessed substrate within the tool is calibrated based on the temperature measurements, the position of the unprocessed substrate, and any temperature anomalies. Therefore, the above described system can be used for centering substrates on a substrate support without opening the tool and without using processed substrates.

BRIEF DESCRIPTION OF THE DRAWINGS

For a better understanding of the nature and objects of the invention, reference should be made to the following detailed description, taken in conjunction with the accompanying drawings, in which.

Like reference numerals refer to corresponding parts throughout the several views of the drawings.

DETAILED DESCRIPTION OF THE INVENTION

Figure 1:
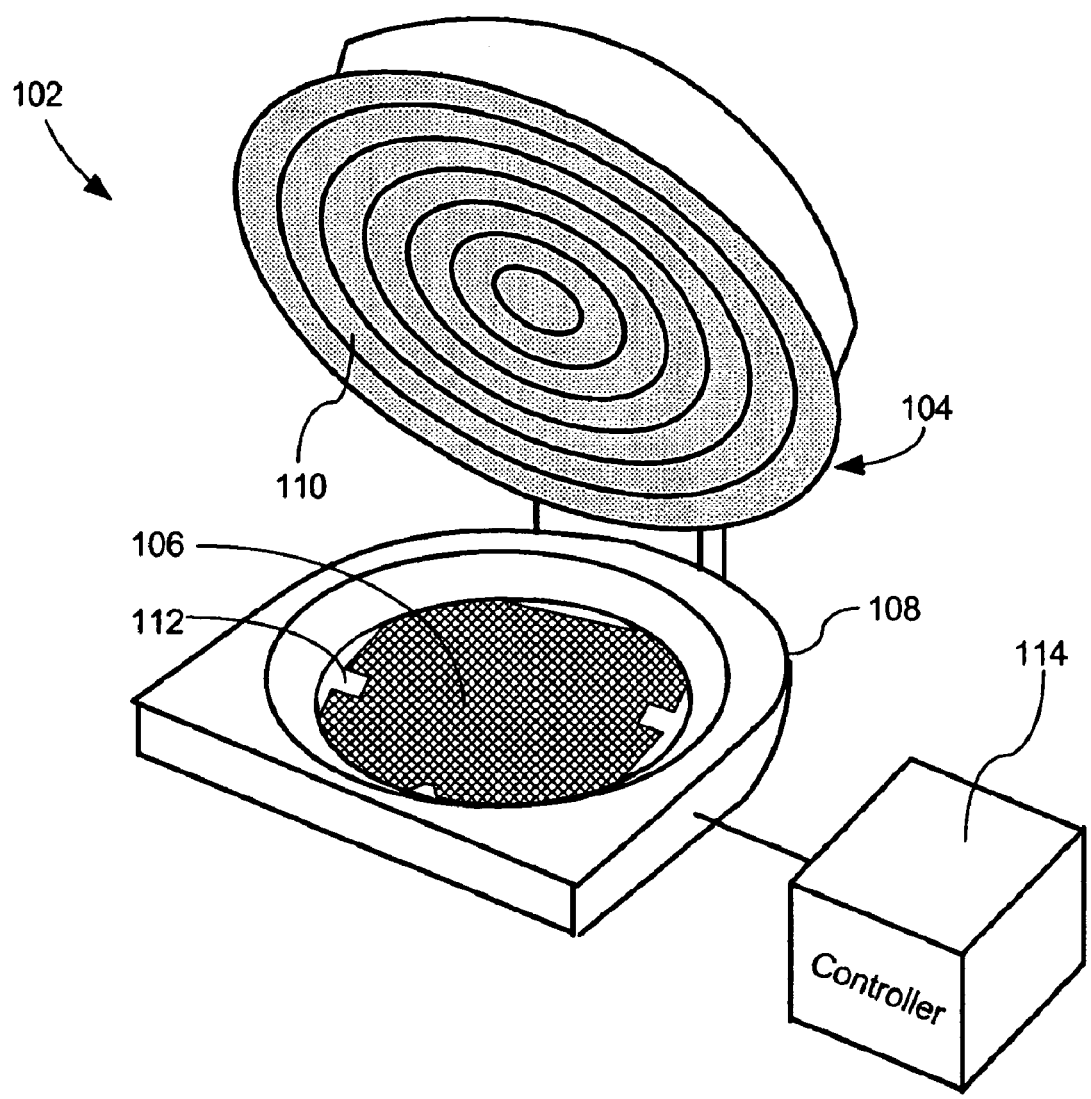
FIG. 1 is a isometric view of a prior art Rapid Thermal Processing (RTP) system.
Figure 2A:
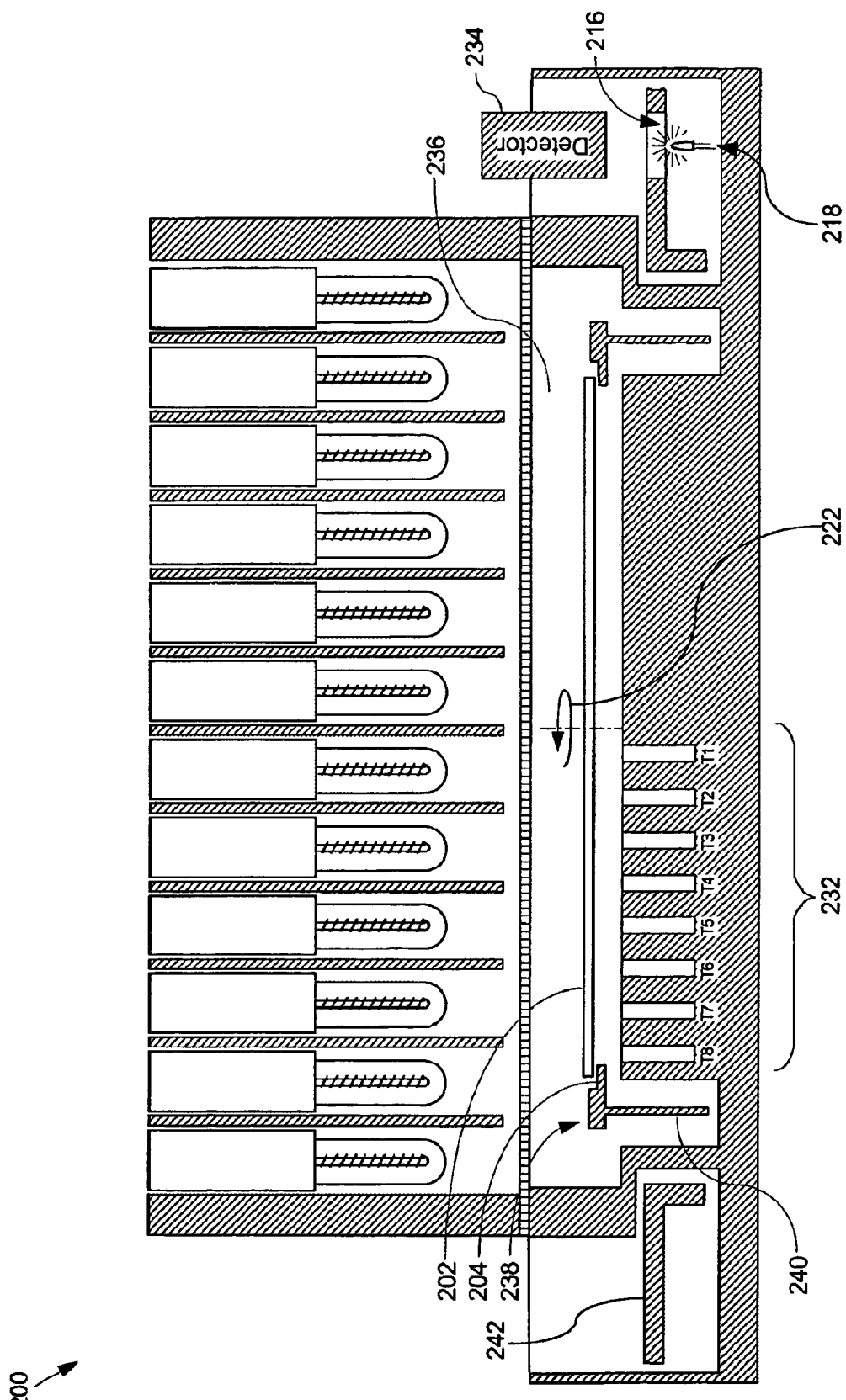
FIG. 2A is a cross-sectional view of a system for controlling thermal processes, according to an embodiment of the invention.
Figure 2B:
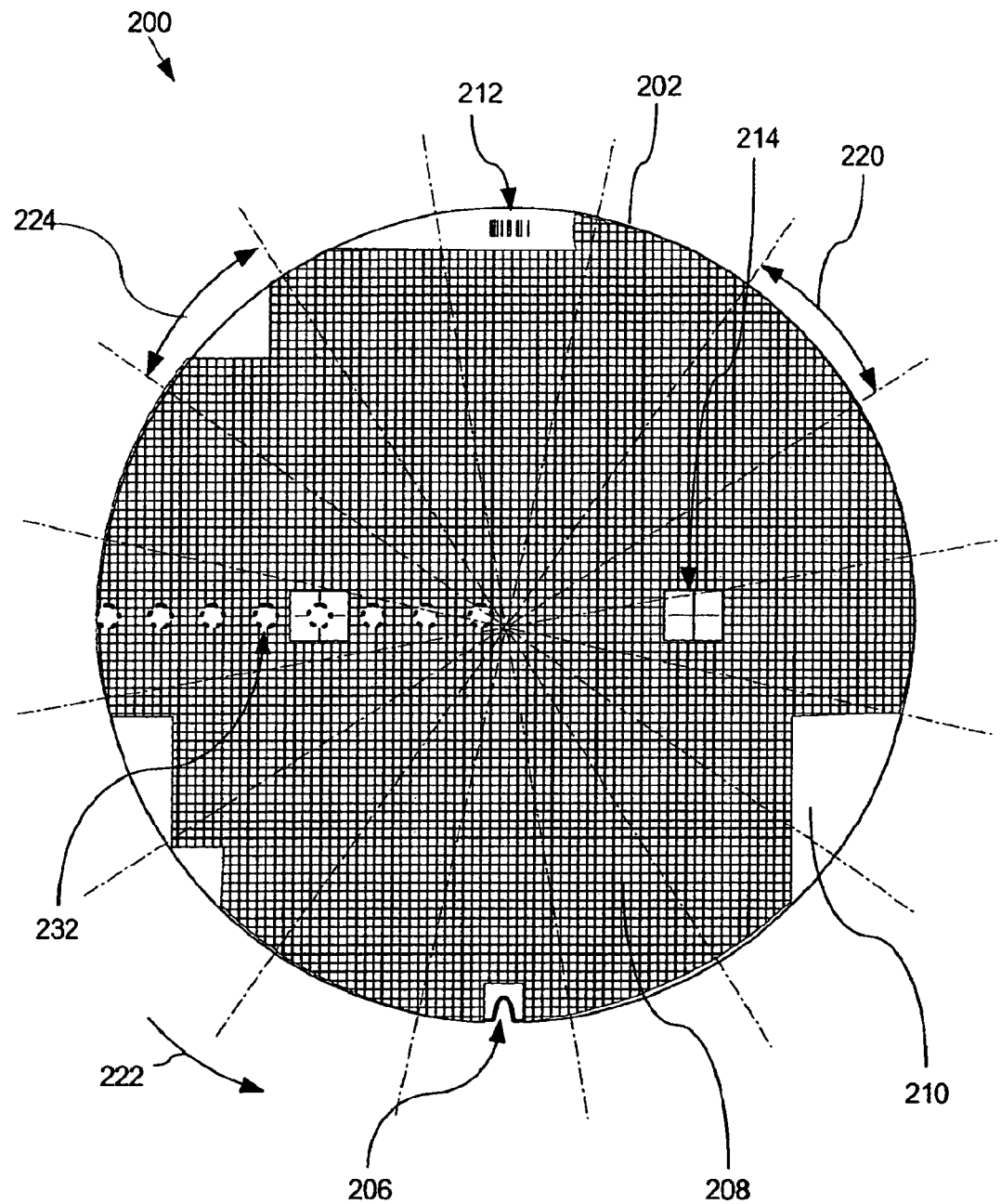
FIG. 2B is a top view of the substrate shown in FIG. 2A.

The present invention is used to filter temperature anomalies in semiconductor thermal processes, such as RTP. This reduces substrate slip and warpage, as well as substrate non-uniformities caused by exposing different portions of the substrate to different temperatures. This also stabilizes the controller and/or radiation source by eliminating oscillation induced by measured temperature anomalies. FIG. 2A is a cross-sectional view of a system 200 for controlling thermal processes, according to an embodiment of the invention, while FIG. 2B is a top view of the substrate 202 shown in FIG. 2A. In use, a semiconductor substrate 202 is placed on a rotating substrate support 204, such as a slip ring, in a thermal processing tool, such as a RTP chamber 236. The semiconductor substrate 202 typically includes one or more IC area/s 208 and one or more open area/s 210, as best seen in FIG. 2B. The open area's 210 may be formed near the edge of the semiconductor substrate 202 or near features where ICs cannot easily be formed. Such features may include: a notch 206 used to align the semiconductor substrate 202 on the substrate support 204, or within any other tool; alignment or registration marks 214 on the substrate, which are used to align semiconductor masks; a laser scribe or other identification mark 212 for identifying each particular substrate; or the like. The substrate support 204 is preferably annular shaped and includes a lip 238 that supports the substrate 202. The substrate support 204 also preferably comprises a rotatable tubular quartz cylinder 240 coupled to the lip 238. The tubular quartz cylinder 240 is preferably rotated by a magnetically coupled drive mechanism (not shown). In a preferred embodiment, the substrate support 204 is magnetically coupled to a flange 242 extending radially outward from the substrate 202. This magnetic coupling causes the flange 242 to rotate together with the substrate support 204 about the substrate's center, as depicted by arrow 222.

Still further, the system 200 includes a position detector for detecting the position of the semiconductor substrate 202 relative to a stationary object. In a preferred embodiment, the position detector detects the angular position of the semiconductor substrate 202 relative to the chamber 236. Such a position detector preferably includes an angular sensor comprising a stationary light source 218, such as a Light Emitting Diode (LED), and a stationary light detector 234 (FIG. 2A), such as a photo diode. A notch or hole 216 through the flange 242 is also preferably provided to allow light emitted from the light source 218 to be detected by the light detector 234 (FIG. 2A). In a preferred embodiment only one hole is provided to detect each rotation (360°) of the substrate. In an alternative embodiment, multiple holes could be provided, such that the light detector could detect light emitted from the light source multiple times a rotation.

In use, a signal from the light source 218 is used to reset a counter. In other words, each time the signal rises, the counter is reset to zero. As the rotational speed of the substrate is constant, the signal from the light source 218 and the counter are used to calculate the angular position of the substrate. Therefore, by interpolating between the signal received from the position detector, a controller can determine the angular position of the substrate at any time, as explained in further detail below in relation to FIG. 3. See also the rotation angle 506 in FIGS. 5A and 5B below. Further details of a system 200 maybe found in U.S. Pat. Nos. 5,660,472; 5,689,614; 5,755,511; 5,781,693; 6,123,766; 6,350,964; 6,395,363, all of which are incorporated herein by reference.

Multiple temperature sensors or probes 232 (marked T1 to T8) are provided and extend from the center to the edge of the semiconductor substrate 202. It should be appreciated that more or fewer temperature probes may be used, or that the temperature probes may be located elsewhere, such as embedded into the substrate support 204. Suitable examples of temperature probes are disclosed in U.S. Pat. Nos. 6,406,179 and 6,226,453, both of which are incorporated herein by reference.

Figure 3:
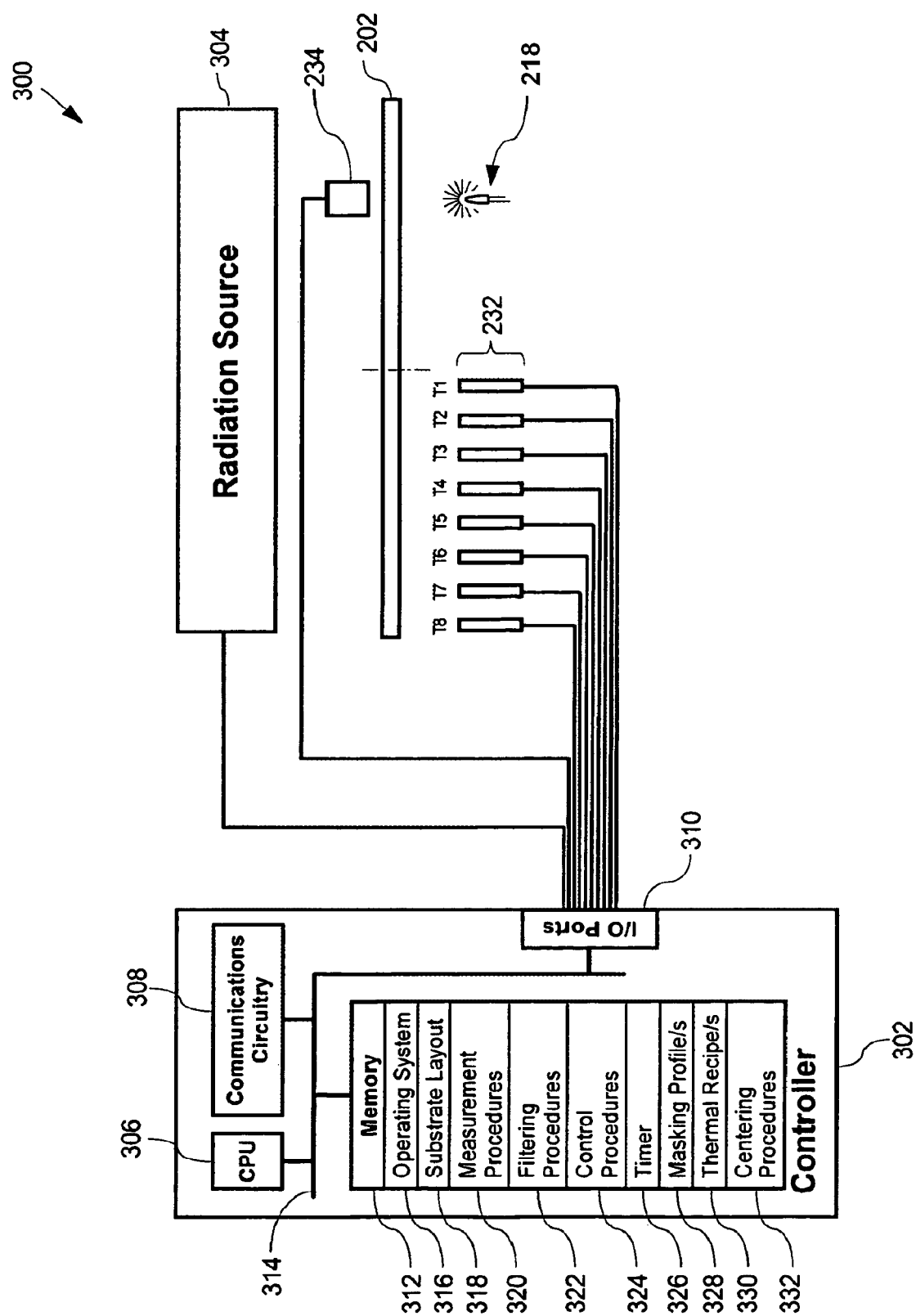
FIG. 3 is a schematic view of a system for controlling thermal processes, according to an embodiment of the invention.

FIG. 3 is a schematic view of a system 300 for controlling thermal processes, according to an embodiment of the invention. The system 300 comprises the substrate support 204 configured to receive the semiconductor substrate 202, as described in relation to FIGS. 2A and 2B. The light detector 234 and temperature probes 232 are coupled to a controller 302. A radiation source 304 is also coupled to the controller 302. The radiation source 304 is used to heat the semiconductor substrate 202, and preferably comprises multiple concentric zones of heating lamps. Each zone of heating lamps preferably aligns with a corresponding temperature probe 232.

The controller 302 receives temperature readings from the temperature probes 232. The controller also receives a detection signal from the light detector 234 once every revolution (360°) of the substrate support 204. The controller 302 then outputs a control signal, preferably variable voltage or power, to the radiation source 304 to control the heat applied to the semiconductor substrate 202.

In a preferred embodiment, the controller 302 comprises the following components: at least one data processor or central processing unit (CPU) 306; communications circuitry 308; input ports 310 configured for communicating with the temperature probes and the position detector; output ports 310 configured for communicating with the radiation source; a memory 312; and at least one bus 314 that interconnects these components.

The memory 312 preferably includes an operating system (OS) 316, such as UNIX™, LINUX™, VXWORKS™, or WINDOWS™, having instructions for processing, accessing, storing, or searching data, etc. The memory 312 also preferably includes a layout file 318 of the semiconductor substrate 202 undergoing thermal processing, which includes the location of the IC area's 208 (FIG. 2B) and the open area's 210 (FIG. 2B); measurement procedures 320 for receiving and processing measured temperatures received from the temperature probes 232 and light detector 234; filtering procedures 322 for performing the method described below in relation to FIG. 4; control procedures 324 for controlling the radiation source 304; a timer 326 for keeping time; masking profile/s 328 used to filter out temperature anomalies; thermal recipe/s 330 for directing thermal processing of the substrate; and centering procedures 332, as described below in relation to FIG. 6.

and the repeated pattern is extracted and correlated to the substrate layout in the layout file.

Once the substrate layout has been determined at step 402, the layout is stored at step 408 as a masking profile 328 (FIG. 3) in the controller memory. An example of a masking profile 328 (FIG. 3) is:

| Angle Start | Angle End | Replace T8 | Replace T7 | Replace T6 | Replace T5 | Replace T4 | Replace T3 | Replace T2 | Masking Profile |
| --- | --- | --- | --- | --- | --- | --- | --- | --- | --- |
| 0 | 45 | 1 | 0 | 0 | 0 | 0 | 0 | 0 | 1000000 |
| 45 | 140 | 0 | 0 | 0 | 0 | 0 | 0 | 0 | 0000000 |
| 140 | 220 | 0 | 0 | 1 | 0 | 0 | 0 | 0 | 0010000 |
| 220 | 320 | 1 | 1 | 0 | 0 | 0 | 0 | 0 | 1100000 |
| 320 | 360 | 0 | 0 | 0 | 0 | 0 | 0 | 0 | 0000000 |

Figure 4:
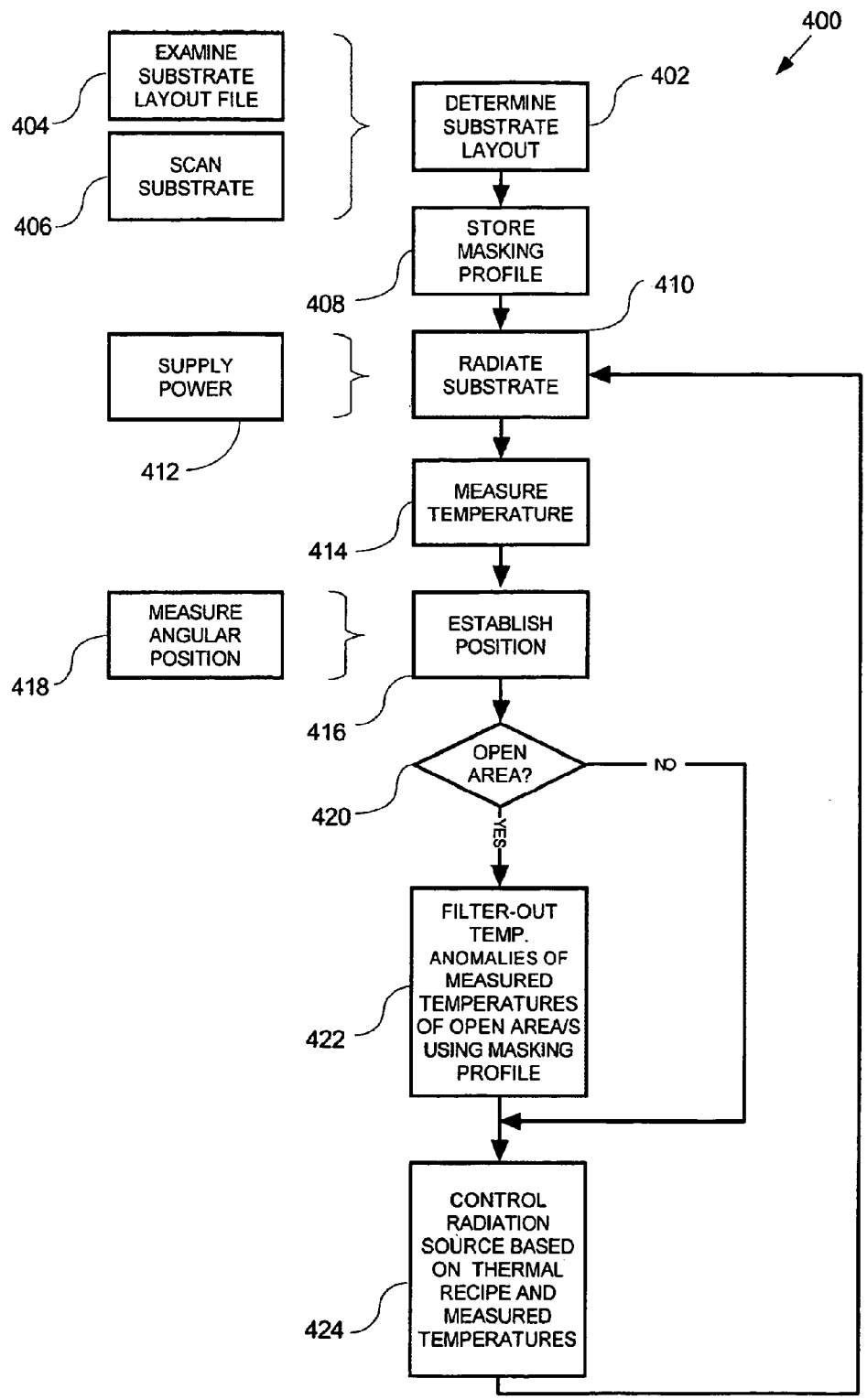
FIG. 4 is a flow chart of a method for filtering temperature anomalies in semiconductor thermal processes, according to an embodiment of the invention.

FIG. 4 is a flow chart of a method 400 for filtering temperature anomalies in semiconductor thermal processes. Once a semiconductor substrate 202 (FIG. 2A) is positioned on the substrate support 204 (FIG. 2A) and the method 400 for filtering temperature anomalies in the thermal process is initiated, the filtering procedures 322 (FIG. 3) determine the substrate layout at step 402. Determining the substrate layout may be accomplished by examining the substrate layout file 318 (FIG. 3) at step 404, i.e., downloading the layout from the fabrication automation host with the lot identifier. This substrate layout file 318 indicates which portions of the semiconductor substrate 202 (FIG. 2B) have IC area/s 208 (FIG. 2B) and which have open area/s 210 (FIG. 2B). Alternatively, the substrate maybe scanned at step 406 to determine which areas of the substrate have open area's 210 (FIG. 2B). This is accomplished by the control procedures 324 (FIG. 3) supplying power to the radiation source 304 (FIG. 3) while the substrate support 204 (FIG. 3) is rotated. This applied power causes the radiation source to apply heat (preferably at a low temperature) to the substrate. At the same time, the temperature probes 232 (FIG. 3) transmit the temperature at each temperature probe to the controller 302 (FIG. 3). The light detector 234 (FIG. 3) also transmits a signal indicating each full rotation of the substrate support to the controller. The filtering procedures 322 (FIG. 3) use this signal as well as a time signal received from the timer 326 (FIG. 3) to interpolate the angular position of the substrate. Each time a temperature spike or anomaly is measured by a temperature probe, the filtering procedures record the number or location of the temperature probe and the angular position where the anomaly occurred. In other words, whenever an anomaly is measured, the filtering procedures record that an open area exists at the temperature probe and angular position where the anomaly was recorded. For example, returning to FIGS. 2A and 2B, the temperature probe T8 will record an anomaly when the angular position of the substrate is at position 224. This indicates to the controller that an open area is located at position 224. The remainder of the temperature probes T1-T7 will not measure an anomaly as the semiconductor substrate adjacent these temperature probes contains ICs, i.e., is an IC area. Similarly, all temperature probes will measure standard temperatures (no anomalies) when segments having only IC areas, such as segment 220, rotate past the temperature probes. In a preferred embodiment, heating the substrate to 500° C., rotating the substrate, and taking temperature measurements for 3 seconds is sufficient for calculating the mask.

In an alternative embodiment, the temperature readings of all temperature probes are recorded over several rotations, where the signal received from the light detector 234 (FIG. 2A) is translated into a circular angle from 0 to 360°. Here, the angular position of the substrate is divided into 5 segments, i.e., 0-45°, 45-140°, 140-220°, 220-320°, and 320-360°. In a preferred embodiment, the masking profile includes a digital number for each segment that represents the temperature probe where a temperature anomaly was detected. For example, for an angular position between 220 and 320°, the masking profile 1100000 indicates that the measured temperature values from temperature probes T8 and T7 should be filtered. If no open area/s exist on a substrate, then an empty masking profile (only zeros) is stored.

The control procedures 324 (FIG. 3) then radiate the substrate at step 410 by, for example, exposing the substrate to heat generated by heat lamps. This is preferably accomplished by supplying power to the radiation source 304 (FIG. 3), at step 412. For example, the substrate is rotated at a predetermined rotational speed while being heated in accordance with the thermal recipe to a stabilization temperature. This initiates the thermal process in accordance with the thermal recipe 330 (FIG. 3). The temperature at each probe is subsequently measured at step 414. In a preferred embodiment, temperature measurements are taken every 50 ms.

The measurement procedures 320 (FIG. 3) establish the substrate position at step 416. In a preferred embodiment, this is accomplished by measuring the angular position of the substrate at step 418 using the angular sensor, which as mentioned previously preferably comprises a light source 218 (FIG. 2A), such as a Light Emitting Diode (LED), and a light detector 234 (FIG. 2A). Also in a preferred embodiment, an angular signal is obtained from the angular sensor once every revolution of the substrate. To determine the angular position at any current time, the filtering procedures interpolate the angular position of the substrate using the angular signal, the time that the angular signal was taken, and the cur'ent time.

Once the substrate position has been established at step 416, the filtering procedures determine at step 420 whether there is an open area on the particular substrate being processed for the particular position established by the measuring procedures. In other words, the filtering procedures lookup the substrate position in the masking profile 328 (FIG. 3) to determine whether any temperatures measured by the temperature probes, at that substrate position, should be filtered. If there are no open areas (420-No), then the control procedures 324 (FIG. 3) control the radiation source 304 (FIG. 3) at step 424 based on the thermal recipe 330 (FIG. 3) and the measured temperatures as is usual. One suitable means for controlling the radiation source is disclosed in U.S. Pat. No. 6,123,766, which is incorporated herein by reference.

However, if there are open areas (420-Yes), then the filtering procedures 322 (FIG. 3) filter-out the measured temperatures at the open area's, at step 422. In other words, the filtering procedures filter-out any measured temperature spikes or anomalies before transmitting the measured temperatures to the control procedures 324 (FIG. 3). To accomplish this, the filtering procedures utilize both the measured substrate position (step 418) and the masking profile 328 (FIG. 3) for the particular substrate being processed. In a preferred embodiment, this filtering step (step 422) simply replaces the measured temperature spike or anomaly with a filtered temperature.

The filtering procedures may use any suitable calculation to determine the filtered temperature. For example, the measured temperature may simply be replaced with the temperature measured at the central temperature probe, as no open areas should exist at the center of the substrate, such as at T1 (FIG. 2A). Alternatively, the filtered temperature may be calculated using one of the following equations:

$$T_{4Filtered} = T_{1Raw};$$

$$T_{4Filtered} = T_{3Raw};$$

$$T_{4Filtered} = T_{5Raw};\text{ and}$$

$$T_{4Filtered} = T_{1Raw} + \Delta T_{14Raw};\text{ with}$$

$$\Delta T_{14Raw} = \frac{1}{n}\sum_{i=1}^{n} T_{4Raw}[k-i] - T_{1Raw}[k-i]$$

where $T_{4Raw}$ is the unfiltered or raw temperature at T4;
$T_{4Filtered}$ is the filtered temperature at T4;
$T_{1Raw}$ is the temperature measured at or near the center of the substrate, i.e., at T1;
$T_{5Raw}$ is the temperature at a temperature probe closer to the substrate edge than that measured at $T_{4Raw}$;
$T_{3Raw}$ is the temperature at a temperature probe closer to the substrate center than that measured at $T_{4Raw}$;
k is the time step when filtering starts (for instance at a $k^{th}$ time step of 50 ms);
i is the number of time steps (1, 2, ..., n); and
n is the maximal number of time steps prior to k that is used to calculate $\Delta T_{14Raw}$.

The control procedures 324 (FIG. 3) then control the radiation source 304 at step 424 (FIG. 3) based on the thermal recipe 330 (FIG. 3), the measured temperatures, and any filtered temperatures.

Figure 5A:
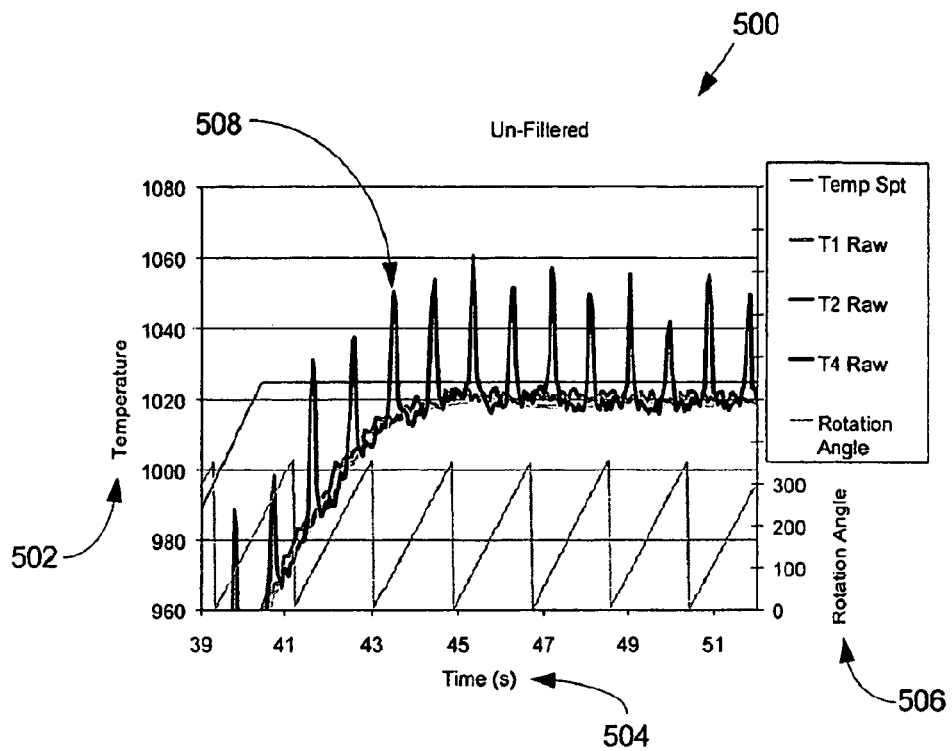
FIG. 5A is a graph of an example of an unfiltered semiconductor thermal process.

FIG. 5A is a graph of an example of an unfiltered semiconductor thermal process 500. The graph 500 shows measured substrate temperature 502 versus time 504 for part of a thermal recipe 330 (FIG. 3), which requires a ramp-up in temperature from about 960° C. to a steady-state or soak temperature of approximately 1020° C.

A rotation angle axis 506 shows the rotation of the substrate from 0 through 360°. In this example, the substrate rotates once every 0.25 seconds. Furthermore, as the angular sensor preferably only generates a signal once every 360°, the filtering procedures 322 (FIG. 3) interpolate the angular position of the substrate between signals.

In this example, the temperature probe T4 deletes a temperature anomaly or spike 508 twice every 360° (roughly at rotation angles of 90 and 270°). To address these temperature anomalies, prior art controllers would then adjust the heat generated by the radiation source 304 (FIG. 3) to attempt to get the measured temperatures to conform to the thermal profile. However, such control causes unstable oscillation of the controller and/or radiation source.

Figure 5B:
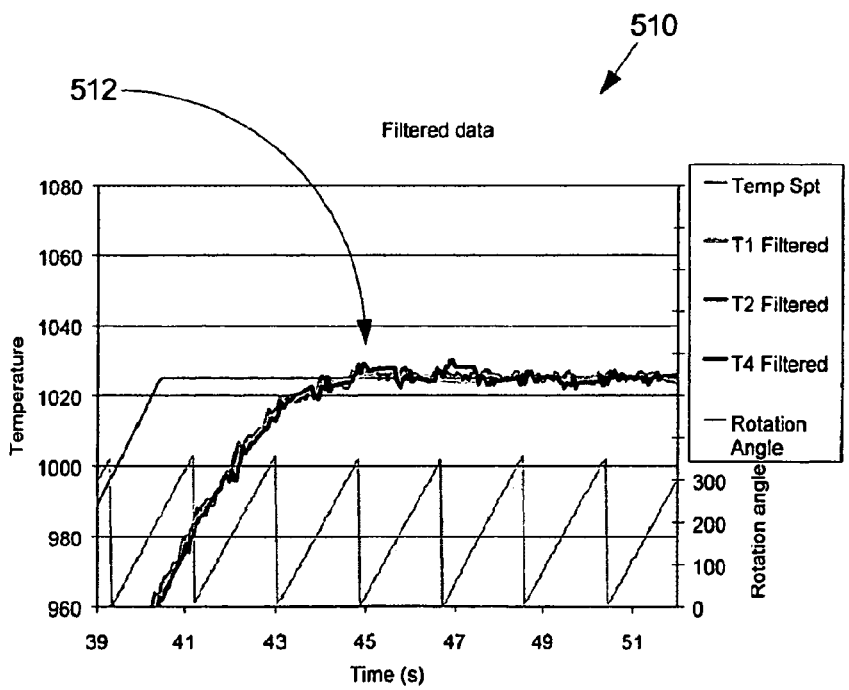
FIG. 5B is a graph of an example of a filtered semiconductor thermal process, according to an embodiment of the invention.

FIG. 5B is an example of a graph 510 of a filtered semiconductor thermal process, according to an embodiment of the invention. Here, the filtering procedures 322 (FIG. 3) have all but eliminated the temperature anomalies or spikes, using the masking profile for the substrate being processed and the measured angular position of the substrate. The above described method allows the controller 302 (FIG. 3) to attain a temperature profile 512 that filters-out any unwanted temperature anomalies measured by the temperature probes 232 (FIG. 3), thereby substantially matching the desired thermal recipe.

Figure 5C:
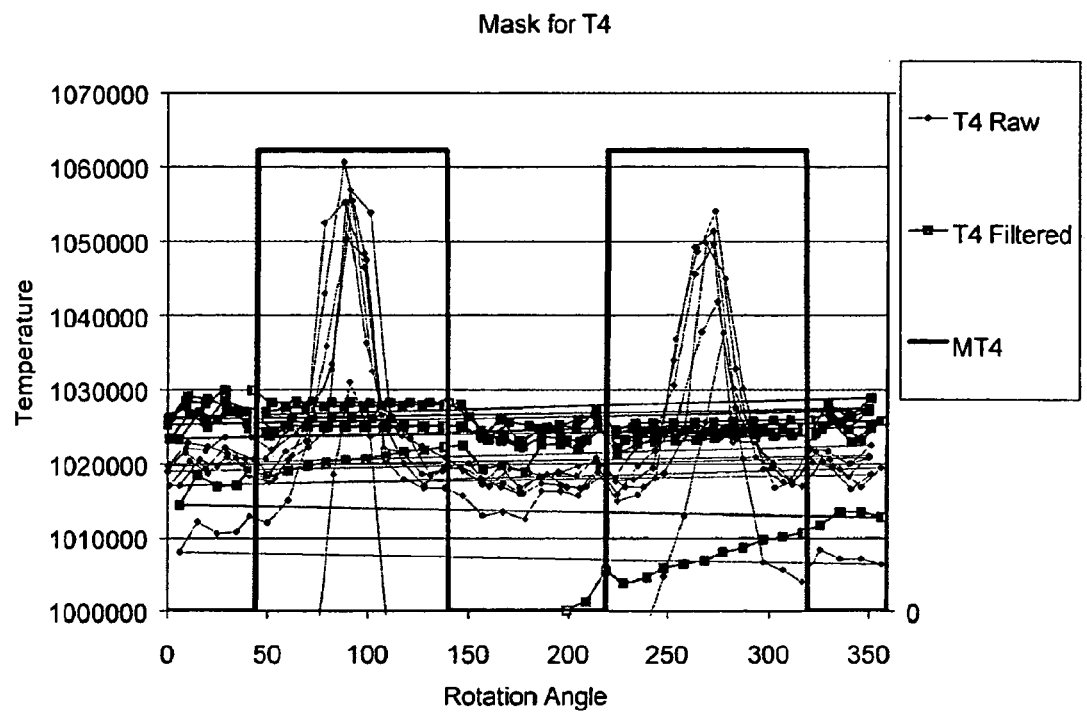
FIG. 5C is a graph of the filtered and unfiltered semiconductor thermal process shown in FIGS. 5A and 5B.

FIG. 5C is another graph of the filtered and unfiltered semiconductor thermal processes shown in FIGS. 5A and 5B. Here, the temperature measured at temperature probe T4 is shown versus the rotation angle of the substrate. As can be seen, the temperature as measured at T4 (T4 Raw) spikes at angular positions of the substrate of about 90 and 270°. The masking profile (MT4) is used to filter-out any temperature readings from T4 between about 48-148° and between about 220-320°. Therefore, the temperature as measured at T4 is reduced to a filtered temperature for T4 (T4 Filtered).

In another embodiment, repeated temperature anomalies can be removed from the signals of all temperature probes, further smoothing the controller input.

Figure 6:
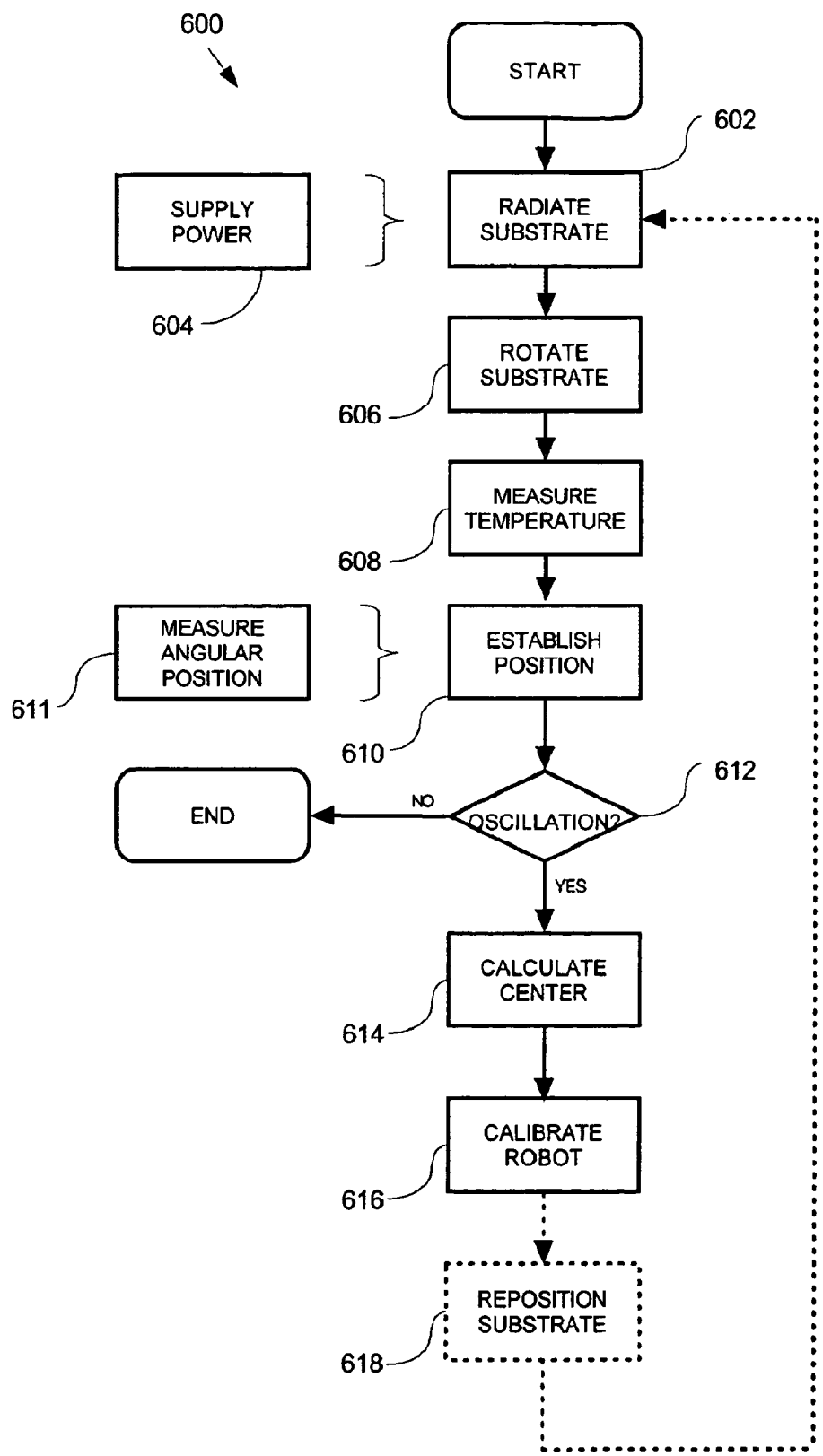
FIG. 6 is a flow chart of a method for finding the center of a substrate, according to yet another embodiment of the invention.

FIG. 6 is a flow chart of a method 600 for finding the center of a substrate, according to yet another embodiment of the invention. This method uses the system 200 described above in relation to FIGS. 2 and 3 to center substrates on a substrate support without opening the tool and without using processed substrates.

Once an unprocessed substrate (i.e. a substrate that has no transistors thereon) has been loaded onto a substrate support in a chamber, the unprocessed substrate is radiated at step 602, preferably by applying power to the radiation source at step 604. The unprocessed substrate is preferably heated to a process temperature of between 500 and 1000° C. The unprocessed substrate is rotated at step 606. The outermost temperature probe, e.g., T8, then takes temperature measurements, at step 608. The position of the unprocessed substrate is determined at step 610 when each temperature is measured. In a preferred embodiment, this is accomplished by measuring the angular position of the unprocessed substrate at step 611.

The control procedures 324 (FIG. 3) then determine whether the temperature measured by the outermost temperature probe oscillates, at step 612. If the substrate is centered correctly above the temperature probes, then the outermost temperature probe will measure a constant temperature. However, if the substrate is not centered correctly, then the outermost temperature probe will measure an oscillating temperature, i.e., a sinusoidal oscillation of the outermost temperature probe reading. By relating this temperature oscillation to the angular position of the substrate, both phase and amplitude of the signal can be calculated.

If an oscillation exists (612-Yes), the centering procedures 332 (FIG. 3) use the measured temperatures (temperature oscillation) together with the position of the substrate to calculate the center of the substrate, at step 614. The centering procedures 332 (FIG. 3) then re/calibrate a transfer robot (not shown, but generally positioned within a transfer chamber external to the RTP chamber) with the new substrate center, at step 616. The transfer robot will then place subsequent substrates into the chamber in accordance with the newly provided centering information.

In an alternative embodiment, the substrate is then repositioned in the chamber by the transfer robot, at step 618. The process is then repeated until no temperature oscillation is measured (612-No), thereby ensuring that the unprocessed substrate has been correctly centered.

The foregoing descriptions of specific embodiments of the present invention are presented for purposes of illustration and description. They are not intended to be exhaustive or to limit the invention to the precise forms disclosed. Obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Furthermore, the order of steps in the method are not necessarily intended to occur in the sequence laid out. It is intended that the scope of the invention be defined by the following claims and their equivalents.

What is claimed is:

1. A method of heating a semiconductor substrate in a thermal processing tool having a radiant heat source and a temperature sensor arranged to measure the temperature of the substrate, the method comprising:

placing the substrate on a rotating substrate support in the thermal processing tool;

heating the substrate with the radiant heat source while rotating the substrate on the substrate support;

taking a plurality of temperature readings from the temperature sensor, the temperature sensor having a known radial position about the center of the substrate;

monitoring rotation of the substrate support by generating an angular signal at least once per full rotation of the substrate support;

establishing an angular position for each temperature reading of the plurality of temperature readings by interpolation using the an angular signal and a time signal; and identifying one or more temperature readings of the plurality of temperature readings from the temperature sensor to be filtered out and removed from calculations used to control the radiant heat source based on the angular and radial positions of the readings.

2. The method of heating a substrate of claim 1 wherein the angular signal is generated only once per full rotation of the substrate support.

3. The method of heating a substrate of claim 1 further comprising replacing a temperature reading identified in the step of identifying one or more temperature readings of the plurality of temperature readings from the temperature sensor to be filtered out and removed from calculations used to control the radiant heat source based on the angular and radial positions of the readings with a replacement reading, and controlling the radiant heat source based in part on the replacement reading.

4. The method of heating a substrate of claim 3 wherein the replacement reading comprises a temperature reading from an angular and radial position that is not filtered out.

5. The method of heating a substrate of claim 3 wherein the replacement reading comprises a temperature reading calculated from a plurality of temperature readings at various angular and radial positions that are not filtered out.

6. The method of heating a substrate of claim 1 wherein the angular and radial position of a temperature reading that was identified as a reading to be filtered out corresponds to an open area of the semiconductor substrate.

7. The method of heating a substrate of claim 1 further comprising communicating temperature readings and the angular and radial position of the readings to a controller that controls the radiant heat source.

8. The method of heating a substrate of claim 1 wherein, prior to taking the plurality of temperature readings the substrate is allowed to reach a predetermined rotational speed.

9. The method of heating a substrate of claim 1 wherein the substrate is heated by radiating the substrate with energy in accordance with a thermal recipe.

10. A method of heating a semiconductor substrate in a thermal processing tool having a radiant heat source and a temperature sensor arranged to measure the temperature of the substrate, the method comprising:

determining a layout of the substrate that identifies open areas of the substrate;

placing the substrate on a rotating substrate support in the thermal processing tool;

heating the substrate with the radiant heat source while rotating the substrate on the substrate support;

monitoring rotation of the substrate support by generating an angular signal at least once per full rotation of the substrate support;

taking a plurality of temperature readings from the temperature sensor;

establishing an angular position and a radial position about the center of the substrate for each temperature reading of the plurality of temperature readings; and using the layout of the substrate and angular and radial positions of the readings to identify one or more temperature readings of the plurality of temperature readings to be filtered out and removed from a calculation used to control the radiant heat source.

11. The method of heating a substrate of claim 10 wherein the layout of the substrate is stored as a masking profile.

12. The method of heating a substrate of claim 10 further comprising replacing at least one temperature reading that was identified as a reading to be filtered out with a replacement reading and controlling the radiant heat source based in part on the replacement reading.

13. The method of heating a substrate of claim 12 wherein the replacement reading comprises a temperature reading calculated from a plurality of temperature readings at various angular and radial positions that are not filtered.

14. A method of heating a semiconductor substrate in a thermal processing tool having a radiant heat source and a plurality of temperature sensors arranged to measure the temperature of the substrate along different concentric known radial positions about the center of the substrate, the method comprising:

placing the substrate on a rotating substrate support in the thermal processing tool;

heating the substrate with the radiant heat source while rotating the substrate on the substrate support;

for each of the temperature sensors in the plurality of temperature sensors, taking a plurality of temperature readings from the respective temperature sensor while the substrate support is rotating;

for each of the plurality of temperature readings taken, establishing an angular position for the particular temperature reading by interpolation using the angular signal and a time signal; and identifying one or more temperature readings of the plurality of temperature readings from the temperature sensor to be filtered out and removed from calculations used to control the radiant heat source based on the angular and radial positions of the readings.

15. The method of heating a substrate of claim 14 further comprising replacing at least one temperature reading that was identified as a reading to be filtered out with a replacement reading and controlling the radiant heat source based in part on the replacement reading the angular and radial positions of the readings.

16. The method of heating a substrate of claim 15 further comprising replacing a temperature reading that was filtered out with a replacement reading and controlling the radiant heat source based in part on the replacement reading.

17. A method of heating a semiconductor substrate in a thermal processing tool having a radiant heat source and a plurality of temperature sensors arranged to measure the temperature of the substrate along different concentric radial positions about the center of the substrate, the method comprising:
   determining a layout of the substrate that identifies open areas of the substrate;
   placing the substrate on a rotating substrate support in the thermal processing tool;
   heating the substrate with the radiant heat source while rotating the substrate on the substrate support;
   monitoring rotation of the substrate support by generating an angular signal at least once per full rotation of the substrate support;
   for each of the temperature sensors in the plurality of temperature sensors, taking a plurality of temperature readings from the respective temperature sensor;
   for each of the plurality of temperature readings taken, establishing an angular position and a radial position about the center of the substrate for the particular temperature reading; and
   using the layout of the substrate and angular and radial positions of the readings to identify one or more temperature readings of the plurality of temperature readings to be filtered out and removed from a calculation used to control the radiant heat source.

18. The method of heating a substrate of claim 17 wherein the layout of the substrate is stored as a masking profile.

19. The method of heating a substrate of claim 18 wherein the masking profile comprises a plurality of masks each representing an angular position on the substrate and each mask having a bit corresponding to one of the temperature sensors in the plurality of temperature sensors that indicates whether or not the temperature reading in the particular mask should be filtered.

20. The method of heating a substrate of claim 17 further comprising replacing at least one temperature reading that was identified as a reading to be filtered out with a replacement reading and controlling the radiant heat source based in part on the replacement reading.

* * * * *